United States Patent
Oonaro et al.

(10) Patent No.: US 11,962,274 B2
(45) Date of Patent: Apr. 16, 2024

(54) AMPLIFIER DEVICE

(71) Applicant: Murata Manufacturing Co., Ltd., Kyoto (JP)

(72) Inventors: Tsutomu Oonaro, Kyoto (JP); Masamichi Tokuda, Kyoto (JP); Makoto Tabei, Kyoto (JP); Kazuaki Deguchi, Kyoto (JP); Takayuki Kawano, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 455 days.

(21) Appl. No.: 17/401,539

(22) Filed: Aug. 13, 2021

(65) Prior Publication Data
US 2022/0069777 A1  Mar. 3, 2022

(30) Foreign Application Priority Data
Aug. 28, 2020  (JP) ................ 2020-145002

(51) Int. Cl.
| H03F 1/30 | (2006.01) |
|---|---|
| H03F 1/02 | (2006.01) |
| H03F 3/21 | (2006.01) |

(52) U.S. Cl.
CPC ........... *H03F 1/301* (2013.01); *H03F 1/0211* (2013.01); *H03F 3/21* (2013.01); *H03F 2200/447* (2013.01); *H03F 2200/451* (2013.01)

(58) Field of Classification Search
CPC ........... H03F 1/301; H03F 1/0211; H03F 3/21
USPC ....................................... 330/296
See application file for complete search history.

(56) References Cited

U.S. PATENT DOCUMENTS

| 4,359,652 A * | 11/1982 | Jarrett ................. F02P 3/0453 |
|---|---|---|
| | | 315/209 T |
| 5,926,062 A | 7/1999 | Kuroda |
| 6,087,820 A | 7/2000 | Houghton et al. |
| 6,194,968 B1 * | 2/2001 | Winslow ................. H03F 3/195 |
| | | 330/285 |
| 6,958,649 B2 * | 10/2005 | Nagamori ............ H03G 3/3042 |
| | | 330/285 |
| 8,305,134 B2 | 11/2012 | Hirose et al. |
| 2004/0104775 A1 * | 6/2004 | Seremeta ................ H03F 3/211 |
| | | 330/310 |
| 2008/0094131 A1 | 4/2008 | Pertijs et al. |
| 2011/0002343 A1 | 1/2011 | Dacosta |
| 2013/0176082 A1 * | 7/2013 | Ishikawa ................. G05F 3/30 |
| | | 331/36 C |
| 2018/0262166 A1 * | 9/2018 | Takagi ................... H03F 3/245 |

FOREIGN PATENT DOCUMENTS

| JP | H1115546 A | 1/1999 |
|---|---|---|
| JP | 2000330658 A | 11/2000 |
| JP | 2008513874 A | 5/2008 |

(Continued)

*Primary Examiner* — Patricia T Nguyen
(74) *Attorney, Agent, or Firm* — Pearne & Gordon LLP

(57) ABSTRACT

An amplifier device includes an amplifier including cascade-connected power amplifiers in a plurality of stages and a bias circuit configured to supply bias currents to the amplifier. A bias current supplied to a power amplifier in the first stage of the power amplifiers in the plurality of stages exhibits a positive temperature characteristic. A bias current supplied to a power amplifier in the final stage exhibits a negative temperature characteristic.

20 Claims, 4 Drawing Sheets

(56) References Cited

FOREIGN PATENT DOCUMENTS

| | | | |
|---|---|---|---|
| JP | 2008165287 | A | 7/2008 |
| JP | 2010003115 | A | 1/2010 |
| JP | 2010231774 | A | 10/2010 |
| JP | 2013098904 | A | 5/2013 |
| JP | 2014048764 | A | 3/2014 |
| JP | 2015222878 | A | 12/2015 |

* cited by examiner

AMPLIFIER DEVICE

CROSS REFERENCE TO RELATED APPLICATION

This application claims priority from Japanese Patent Application No. 2020-145002 filed on Aug. 28, 2020. The content of this application is incorporated herein by reference in its entirety.

BACKGROUND OF DISCLOSURE

1. Field of the Disclosure

The present disclosure relates to an amplifier device including an amplifier and a bias circuit.

2. Description of the Related Art

There is a known amplifier device including an amplifier having a power amplifier and a bias circuit for supplying bias current to the power amplifier. As an example of the bias circuit of this kind of amplifier device, Japanese Unexamined Patent Application Publication No. 2013-98904 discloses a bias circuit including a current mirror circuit and a current supply circuit for supplying current to the current mirror circuit. The current supply circuit includes a temperature compensation circuit. For example, when temperature increases, this bias circuit increases bias current by using the temperature compensation circuit to avoid excessive reduction in the gain of the bias circuit.

BRIEF SUMMARY OF THE DISCLOSURE

For example, when an amplifier is composed of a plurality of cascade-connected power amplifiers, the bias circuit as described above supplies bias current to the individual power amplifiers. However, a plurality of power amplifiers are likely to have different capabilities. As a result, when a bias current exhibiting a given temperature characteristic is supplied to all the power amplifiers, variations in the characteristics of the amplifier including the power amplifiers due to changes in the temperature may be unstable.

An object of the present disclosure is to provide an amplifier device capable of avoiding unstable variations in characteristics due to changes in the temperature.

To achieve the object described above, an amplifier device according to an aspect of the present disclosure includes an amplifier including cascade-connected power amplifiers in a plurality of stages and a bias circuit configured to supply bias currents to the amplifier. A bias current supplied to a power amplifier in the first stage of the power amplifiers in the plurality of stages exhibits a positive temperature characteristic. A bias current supplied to a power amplifier in the final stage of the power amplifiers in the plurality of stages exhibits a negative temperature characteristic.

The amplifier device can avoid unstable variations in characteristics due to changes in the temperature. Other features, elements, characteristics and advantages of the present disclosure will become more apparent from the following detailed description of preferred embodiments of the present disclosure with reference to the attached drawings.

DETAILED DESCRIPTION OF THE DISCLOSURE

Circumstances Behind Present Disclosure

Firstly, circumstances behind the present disclosure will be described by using an amplifier device 101 of a comparative example as an example.

Figure 1:
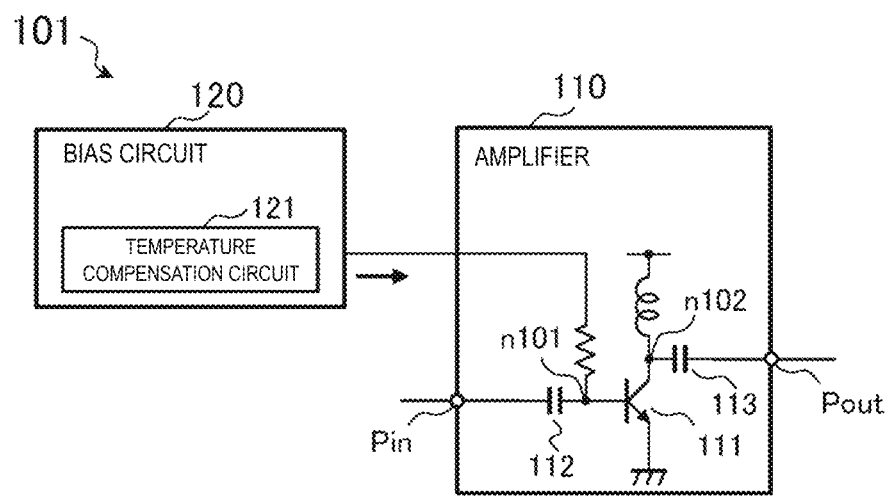
FIG. 1 is a circuit configuration diagram of an amplifier device according to a comparative example.

FIG. 1 is a circuit configuration diagram of the amplifier device 101 according to the comparative example.

The amplifier device 101 of the comparative example includes an amplifier 110 and a bias circuit 120 for supplying bias current to the amplifier 110.

The amplifier 110 is a circuit configured to amplify a radio-frequency signal inputted from a radio-frequency (RF) input terminal Pin and output the amplified radio-frequency signal from an RF output terminal Pout. The amplifier 110 includes an amplifier transistor 111 and direct current (DC) blocking capacitors 112 and 113. The base of the amplifier transistor 111 is coupled to the RF input terminal Pin via the DC blocking capacitor 112. The collector of the amplifier transistor 111 is coupled to the RF output terminal Pout via the DC blocking capacitor 113. The emitter of the amplifier transistor 111 is coupled to the ground. A high-potential power line is coupled to a node n102 between the collector of the amplifier transistor 111 and the DC blocking capacitor 113 via an inductor.

The bias circuit 120 is coupled to a node n101 between the base of the amplifier transistor 111 and the DC blocking capacitor 112 via a resistance element. The bias circuit 120 includes a temperature compensation circuit 121. The bias circuit 120 supplies a bias current exhibiting a desired temperature characteristic to the amplifier transistor 111 via the resistance element and the node n101.

The amplifier 110 of the comparative example includes the single amplifier transistor 111. For example, if the amplifier includes a plurality of the cascade-connected amplifier transistors 111, the bias circuit 120 as described above supplies bias current to the individual amplifier transistors 111. However, a plurality of the amplifier transistors 111 are likely to have different capabilities. As a result, when a bias current exhibiting a given temperature characteristic is supplied to all the amplifier transistors 111, variations in the characteristics of the amplifier including the amplifier transistors 111 due to changes in the temperature may be unstable.

Instead of supplying a bias current having a given temperature characteristic to all the amplifier transistors, an amplifier device according to the present disclosure supplies a bias current exhibiting a temperature characteristic different from the given temperature characteristic to at least one or several of the amplifier transistors. As a result, the amplifier device can avoid unstable variations in characteristics due to changes in the temperature.

Hereinafter, a preferred embodiment of the present disclosure will be described in detail with reference to the drawings. It should be noted that the embodiment described below is a comprehensive or specific instance. Specifics including numerical values, constituent elements, arrangements of the constituent elements, and modes of connection given in the following embodiment are mere instances and are not intended to limit the present disclosure. Among the constituent elements in the following embodiment, constituent elements not recited in any of the independent claims are described as arbitrary constituent elements.

Embodiment

1. Outline of Configuration of Amplifier Device

The outline of a configuration of an amplifier device according to an embodiment will be described with reference to FIGS. 2 to 5.

Figure 2:
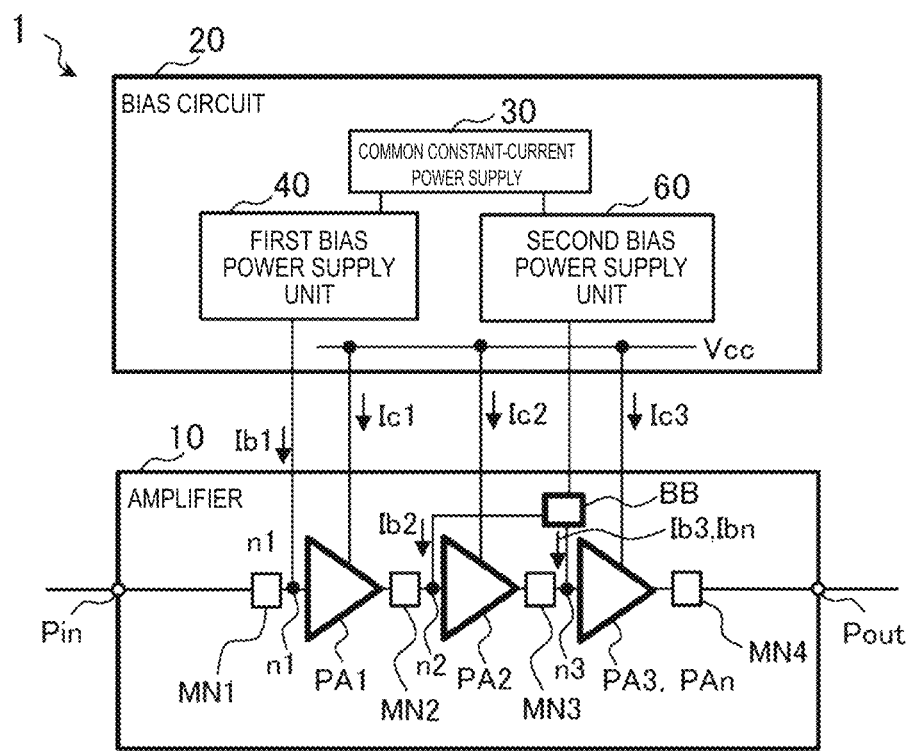
FIG. 2 is a block diagram schematically illustrating a configuration of an amplifier device according to an embodiment.

FIG. 2 is a block diagram schematically illustrating a configuration of an amplifier device 1 according to the embodiment.

The amplifier device 1 includes an amplifier 10 for amplifying radio-frequency signals and a bias circuit 20 for supplying bias current to the amplifier 10. The amplifier 10 is implemented as a first integrated circuit (IC) chip. The bias circuit 20 is implemented as a second IC chip that is different from the first IC chip. A bias branch BB, which will be described later, is provided in the first IC chip.

The amplifier device 1 is installed in, for example, a communication device that transmits and receives radio-frequency signals. The radio-frequency signals inputted to the amplifier device 1 may be, for example, radio-frequency signals in the 2.4 or 5 GHz band of the IEEE 802.11 standard. The amplifier device 1 includes an RF input terminal Pin for inputting radio-frequency signals to the amplifier 10 and an RF output terminal Pout for outputting radio-frequency signals amplified by the amplifier 10.

The amplifier 10 is provided in a path connecting the RF input terminal Pin and the RF output terminal Pout. The amplifier 10 includes cascade-connected power amplifiers provided in a plurality of stages. The amplifier 10 of the present embodiment includes a power amplifier PA1 in the first stage, a power amplifier PA2 in the second stage, and the power amplifier PA3 in the third stage. The power amplifier PA3 in the third stage is also a power amplifier PAn in the final stage. The power amplifiers PA1 to PA3 each include an amplifier transistor. The amplifier transistor may be, for example, a GaAs or SiGe bipolar transistor.

An input terminal of the power amplifier PA1 is coupled to the RF input terminal Pin via a matching network MN1. An output terminal of the power amplifier PA1 is coupled to an input terminal of the power amplifier PA2 via a matching network MN2. An output terminal of the power amplifier PA2 is coupled to an input terminal of the power amplifier PA3 via a matching network MN3. An output terminal of the power amplifier PA3 is coupled to the RF output terminal Pout via a matching network MN4. The matching networks MN1 to MN4 is each a circuit for performing impedance matching between the RF input terminal and a power amplifier, between power amplifiers, or between a power amplifier and the RF output terminal. The matching networks MN1 to MN4 may be constituted by passive elements such as an inductor and a capacitor.

A collector current Ic1 is supplied to the power amplifier PA1 through a high-potential power line Vcc. A collector current Ic2 is supplied to the power amplifier PA2 through the high-potential power line Vcc. A collector current Ic3 is supplied to the power amplifier PA3 through the high-potential power line Vcc. In the amplifier 10, the gain of the power amplifier PA1 in the first stage is the highest, and the output power of the power amplifier PA1 is relatively low; the gain of the power amplifier PA3 in the third stage, which is the final stage, is the lowest, and the output power of the power amplifier PA3 is relatively high.

Although in the present embodiment the amplifier 10 is constituted by the power amplifiers PA1 to PA3 provided in three stages, the number of stages of power amplifiers is not limited to this example. For example, the amplifier 10 may be constituted by power amplifiers provided in n stages (n is an integer equal to or greater than 2), in which a power amplifier in the nth stage serves as the power amplifier PAn in the final stage.

The bias circuit 20 is a circuit for supplying bias current to the amplifier 10. The bias circuit 20 has a function of temperature compensation, in which voltage is controlled to supply a predetermined bias current in accordance with the environmental temperature or temperature at a particular position.

The bias circuit 20 includes a first bias power supply unit 40, a second bias power supply unit 60, and a common constant-current power supply 30.

The common constant-current power supply 30 is a common current source for supplying current to both the first bias power supply unit 40 and the second bias power supply unit 60.

The first bias power supply unit 40 is coupled to a node n1 between the matching network MN1 and the input terminal of the power amplifier PA1. The first bias power supply unit 40 supplies a bias current Ib1 for the first stage to the power amplifier PA1 in the first stage through the node n1.

The second bias power supply unit 60 is coupled to a node n2 between the matching network MN2 and the input terminal of the power amplifier PA2, and a node n3 between the matching network MN3 and the input terminal of the power amplifier PA3 via the bias branch BB. The second bias power supply unit 60 supplies a bias current Ib2 for the second stage to the power amplifier PA2 in the second stage through the bias branch BB and the node n2. The second bias power supply unit 60 also supplies a bias current Ib3 for the third stage to the power amplifier PA3 in the third stage through the bias branch BB and the node n3. In the present embodiment, the bias current Ib3 for the third stage is a bias current Ibn for the final stage, which is supplied to the power amplifier PAn in the final stage.

The bias branch BB includes, for example, a resistor and a current mirror circuit. The bias branch BB appropriately divides and amplifies the output current from the second bias power supply unit 60, and as a result, the bias branch BB outputs the bias current Ib2 to the power amplifier PA2 and the bias current Ib3 to the power amplifier PA3.

The first bias power supply unit 40 and the second bias power supply unit 60 are power supply units having different temperature characteristics. The first bias power supply unit 40 has the proportional to absolute temperature (PTAT) characteristic, in which the current increases as the temperature rises. The second bias power supply unit 60 has the complementary proportional to absolute temperature (CTAT) characteristic, in which the current decreases as the temperature rises. This means that, when the temperature rises, the first bias power supply unit 40 increases the bias current Ib1 supplied to the power amplifier PA1 in the first stage, whereas the second bias power supply unit 60 decreases the bias currents Ib2 and Ib3 supplied to the power amplifiers PA2 and PA3 in the second and third stages.

Figure 3:
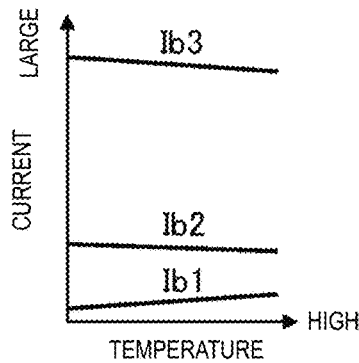
FIG. 3 is a graph illustrating an example of bias currents supplied to an amplifier of the amplifier device according to the embodiment.
Figure 4:
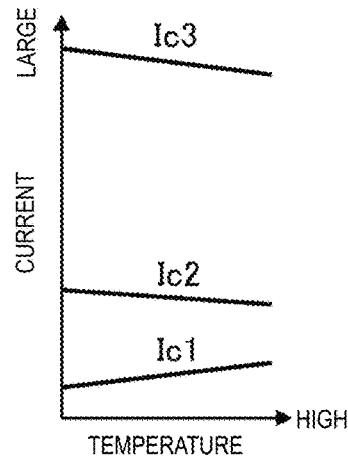
FIG. 4 is a graph illustrating an example of collector currents supplied to the amplifier of the amplifier device according to the embodiment.

FIG. 3 is a graph illustrating an example of the bias currents Ib1, Ib2, and Ib3 supplied to the amplifier 10 of the amplifier device 1. FIG. 4 is a graph illustrating an example of the collector currents Ic1, Ic2, and Ic3 supplied to the amplifier 10 of the amplifier device 1.

FIG. 3 indicates that the bias current Ib1 supplied from the first bias power supply unit 40 to the power amplifier PA1 exhibits the PTAT characteristic, whereas the bias currents Ib2 and Ib3 supplied from the second bias power supply unit 60 to the power amplifiers PA2 and PA3 exhibit the CTAT characteristic. When the bias currents Ib1 to Ib3 are supplied to the power amplifiers PA1 to PA3, the collector currents Ic1 to Ic3 are consumed at the power amplifiers PA1 to PA3. FIG. 4 indicates that the collector current Ic1 consumed at the power amplifier PA1 exhibits the PTAT characteristic, whereas the collector currents Ic2 and Ic3 consumed at the power amplifiers PA2 and PA3 exhibit the CTAT characteristic.

As described above, in the amplifier device 1, the bias current Ib1 supplied to the power amplifier PA1 in the first stage of the power amplifiers PA1 to PA3 provided in a plurality of stages exhibits a positive temperature characteristic, whereas the bias current Ib3 supplied to the power amplifier PA3 in the third stage, which is a power amplifier in the final stage, exhibits a negative temperature characteristic.

In the amplifier device 1, a bias current supplied to a power amplifier in a particular stage of the power amplifiers PA1 to PA3 provided in the plurality of stages exhibits a temperature characteristic more negative than a temperature characteristic exhibited by a bias current supplied to a power amplifier in a stage before the particular stage of the power amplifiers provided in the plurality of stages. Specifically, the bias current supplied to the power amplifier PA2 in the second stage exhibits a temperature characteristic more negative than a temperature characteristic exhibited by the bias current supplied to the power amplifier PA1 in the first stage. The bias current supplied to the power amplifier PA3 in the third stage exhibits a temperature characteristic more negative than a temperature characteristic exhibited by the bias current supplied to the power amplifier PA2 in the second stage. The expression "more negative" denotes that a tangent representing the inclination of a temperature characteristic is closer to $\tan(-90°)$.

As described above, the bias current Ib1 exhibiting a positive temperature characteristic is supplied to the power amplifier PA1 in the first stage, and the bias current Ib3 exhibiting a negative temperature characteristic is supplied to the power amplifier PA3 in the third stage, which is a power amplifier in the final stage. This configuration can reduce the error vector magnitude (EVM), and it is possible to avoid unstable variations in characteristics due to changes in the temperature. The following is a description of the EVM of the amplifier 10 of the amplifier device 1.

Figure 5:
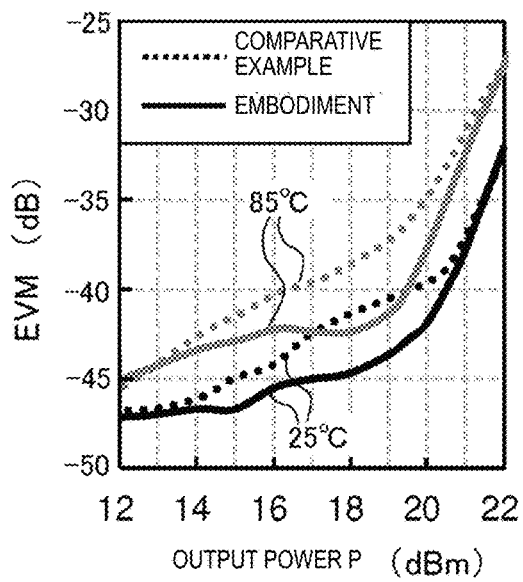
FIG. 5 is a graph illustrating the error vector magnitude (EVM) of the amplifier of the amplifier device according to the embodiment.

FIG. 5 is a graph illustrating the EVM of the amplifier 10 of the amplifier device 1. The EVM is a measure for evaluating the linearity of a device. FIG. 5 illustrates the EVM at 25° C. and the EVM at 85° C.

The dashed lines in FIG. 5 indicate the EVM of the amplifier of the amplifier device of the comparative example. In the amplifier device of the comparative example, a bias current exhibiting a particular temperature characteristic is supplied to the power amplifiers in all the stages.

The solid lines in FIG. 5 indicate the EVM of the amplifier 10 of the amplifier device 1 of the embodiment. In the amplifier device 1 of the embodiment, bias currents exhibiting different temperature characteristics are supplied to the power amplifiers in the individual stages. As illustrated in FIG. 5, while the output power P is within the range of 14 to 20 dBm, the EVM of the embodiment is smaller than the EVM of the comparative example. This means that in the amplifier device 1 of the embodiment the temperature characteristic of each bias current is optimized for the power amplifier in the corresponding stage to reduce the EVM.

As an example of optimizing the temperature characteristic, for example, the bias current Ib1 exhibiting the PTAT characteristic is supplied to the power amplifier PA1 in the first stage, which compensates for decreases in the gain of the power amplifier PA1 due to rises in temperature. The bias current Ib3 exhibiting the CTAT characteristic within a range of power applicable without causing an excessive level of distortion is supplied to the power amplifier PA3 in the third stage, which reduces the current consumption of the power amplifier PA3 when the temperature increases. When the gain of the power amplifier PA2 remains to be sufficient with rises in the temperature and the power does not reach the limit of the applicable power, the bias current Ib2 exhibiting the CTAT characteristic is supplied to the power amplifier PA2 in the second stage. When the gain of the entire amplifier 10 is insufficient, a bias current exhibiting the PTAT characteristic is supplied to the power amplifier PA2 in the second stage. In the example in FIG. 5, the bias current Ib2 exhibiting the CTAT characteristic is supplied to the power amplifier PA2 in the second stage.

As described above, because the temperature characteristic is optimized for a power amplifier in each stage to reduce the EVM, the amplifier device 1 can avoid unstable variations in characteristics due to changes in the temperature.

Although in the amplifier device 1 the bias current Ib2 exhibiting a positive or negative temperature characteristic is supplied to the power amplifier PA2 in the second stage, a constant bias current without any temperature characteristic may be supplied to the power amplifier PA2 in the second stage. This means that, in an amplifier device constituted by power amplifiers provided in three stages in the same manner as the amplifier device 1, a bias current exhibiting a positive temperature characteristic can be supplied to a power amplifier in the first stage, and a bias current exhibiting a negative temperature characteristic can be supplied to a power amplifier in the final stage; in this case, a bias current exhibiting any temperature characteristic can be supplied to a power amplifier in a stage between the power amplifier in the first stage and the power amplifier in the final stage (power amplifier in the second stage).

For example, when a bias current exhibiting a positive temperature characteristic is supplied to both the power amplifier in the first stage and the power amplifier in the second stage, the bias current supplied to the power amplifier in the second stage may exhibit the same temperature characteristic as the temperature characteristic of the bias current supplied to the power amplifier in the first stage or may exhibit a temperature characteristic more negative or more positive than the temperature characteristic of the bias current supplied to the power amplifier in the first stage. For example, when a bias current exhibiting a negative temperature characteristic is supplied to both the power amplifier in the second stage and the power amplifier in the final stage, the bias current supplied to the power amplifier in the second stage may exhibit the same temperature characteristic as the temperature characteristic of the bias current supplied to the power amplifier in the final stage or may exhibit a temperature characteristic more negative or more positive than the temperature characteristic of the bias current supplied to the power amplifier in the final stage.

In an amplifier device in which two or more power amplifiers are provided between the power amplifier in the first stage and the power amplifier in the final stage, in other words, an amplifier device including four or more power amplifiers, it is preferable that a power amplifier to which a bias current exhibiting a positive temperature characteristic or no temperature characteristic is supplied be not provided closer to a power amplifier in the final stage than a power amplifier to which a bias current exhibiting a negative temperature characteristic is supplied.

For example, with regard to an amplifier device constituted by power amplifiers in four stages, in comparison to the configuration in which bias currents exhibiting positive temperature characteristics are supplied to power amplifiers in the first and third stages and bias currents exhibiting negative temperature characteristics are supplied to power amplifiers in the second and final stages, unstable variations in characteristics due to changes in the temperature can be more likely to be avoided with, for example, the following configurations: 1) bias currents exhibiting positive temperature characteristics are supplied to power amplifiers in the first, second, and third stages, and a bias current exhibiting a negative temperature characteristic is supplied to a power amplifier in the final stage; 2) bias currents exhibiting positive temperature characteristics are supplied to the first and second stages, a bias current exhibiting no temperature characteristic is supplied to a power amplifier in the third stage, and a bias current exhibiting a negative temperature characteristic is supplied to a power amplifier in the final stage; 3) a bias current exhibiting a positive temperature characteristic is supplied to a power amplifier in the first stage, and bias currents exhibiting negative temperature characteristics are supplied to power amplifiers in the second, third, and final stages. In this case, bias currents exhibiting similar temperature characteristics, such as the bias currents supplied to power amplifiers in the first, second, and third stages in the configuration 1, may include, in comparison to a bias current supplied to a power amplifier in a particular stage, a bias current exhibiting a more positive, more negative, or the same temperature characteristic supplied to a power amplifier in a stage closer to the final stage than the power amplifier in the particular stage.

2. Functional Configuration of Bias Circuit

Next, a functional configuration of the bias circuit 20 will be described.

Figure 6:
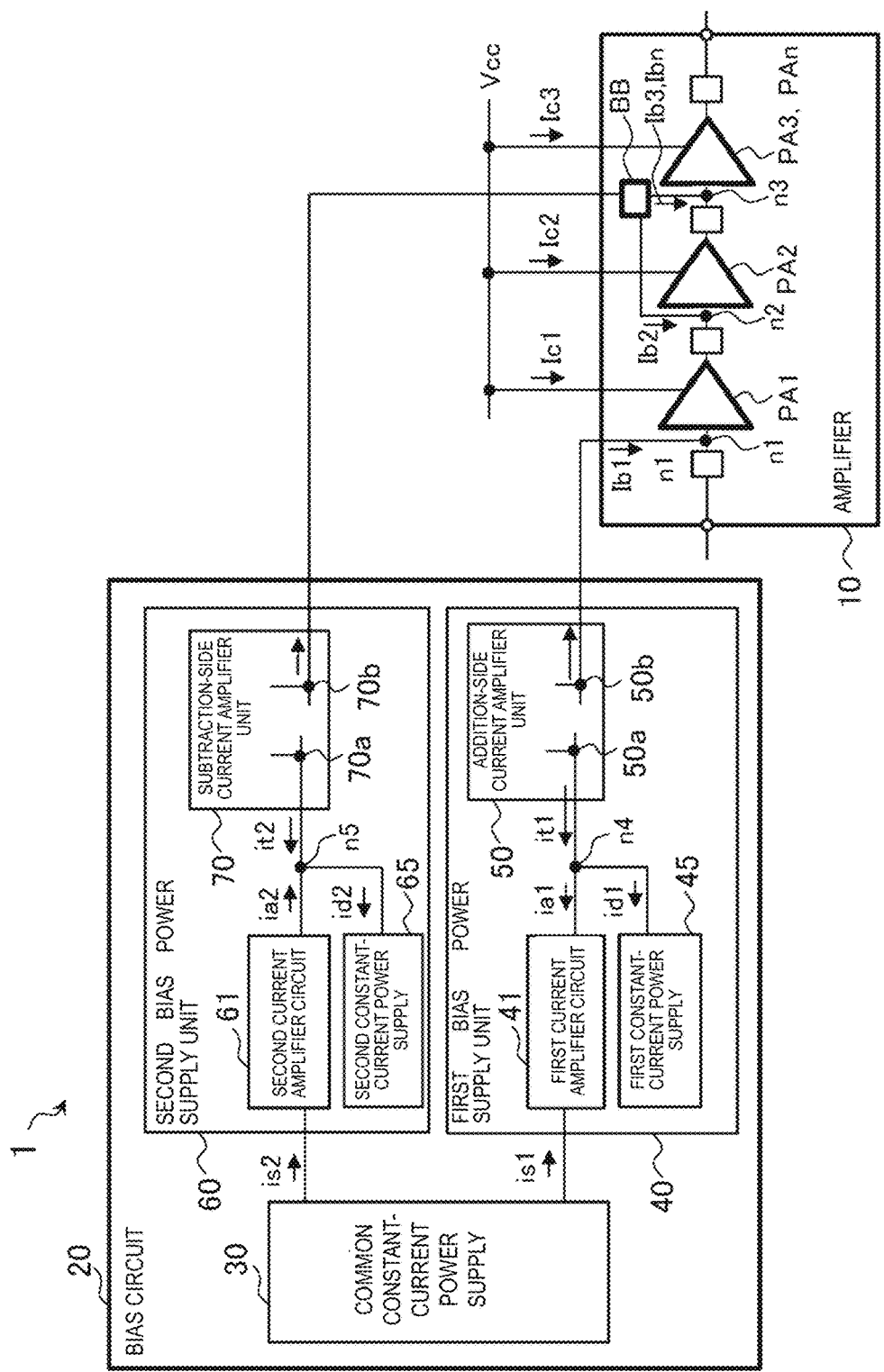
FIG. 6 is a block diagram illustrating a functional configuration of a bias circuit of the amplifier device according to the embodiment.

FIG. 6 is a block diagram illustrating a functional configuration of the bias circuit 20 of the amplifier device 1.

As described above, the bias circuit 20 includes the first bias power supply unit 40, the second bias power supply unit 60, and the common constant-current power supply 30.

The common constant-current power supply 30 is a current source having a positive temperature characteristic. The common constant-current power supply 30 supplies current to both the first bias power supply unit 40 and the second bias power supply unit 60. The common constant-current power supply 30 includes an activation transistor 34 for activating the bias circuit 20.

The first bias power supply unit 40 includes a first current amplifier circuit 41, a first constant-current power supply 45, and an addition-side current amplifier unit 50.

A node 50a on one side of the addition-side current amplifier unit 50 is coupled to both the first current amplifier circuit 41 and the first constant-current power supply 45 via a node n4. A node 50b on the other side of the addition-side current amplifier unit 50 is coupled to the amplifier 10. The node n4 is a node common to the first current amplifier circuit 41, the first constant-current power supply 45, and the addition-side current amplifier unit 50.

The first current amplifier circuit 41 is coupled to the common constant-current power supply 30. The first current amplifier circuit 41 generates a first amplified current ia1 by amplifying a first supply current is1 supplied by the common constant-current power supply 30.

The first constant-current power supply 45 is a constant-current power supply without a function of temperature compensation or having a low degree of temperature dependence. The first constant-current power supply 45 draws a first current draw id1, which is a constant current, from the node 50a on the one side of the addition-side current amplifier unit 50.

At the node n4 of the first bias power supply unit 40, the first amplified current ia1 is added to the first current draw id1 drawn by the first constant-current power supply 45. As a result, a first total current it1 (it1=id1+ia1) obtained by adding the first current draw id1 and the first amplified current ia1 flows at the node 50a on the one side of the addition-side current amplifier unit 50; thus, a first voltage, which is necessary to cause the first total current it1 to flow, is generated across the one side of the addition-side current amplifier unit 50.

When the first voltage is generated across the one side of the addition-side current amplifier unit 50, the first voltage is also generated across the other side of the addition-side current amplifier unit 50, and an amplified current caused by the first voltage is outputted from the node 50b on the other side of the addition-side current amplifier unit 50. The amplified current outputted by the addition-side current amplifier unit 50, which exhibits a positive temperature characteristic, is supplied as the bias current Ib1 to the power amplifier PA1.

The second bias power supply unit 60 includes a second current amplifier circuit 61, a second constant-current power supply 65, and a subtraction-side current amplifier unit 70.

A node 70a on one side of the subtraction-side current amplifier unit 70 is coupled to both the second current amplifier circuit 61 and the second constant-current power supply 65 via a node n5. A node 70b on the other side of the subtraction-side current amplifier unit 70 is coupled to the amplifier 10. The node n5 is a node common to the second current amplifier circuit 61, the second constant-current power supply 65, and the subtraction-side current amplifier unit 70.

The second current amplifier circuit 61 is coupled to the common constant-current power supply 30. The second current amplifier circuit 61 generates a second amplified current ia2 by amplifying a second supply current is2 supplied by the common constant-current power supply 30.

The second constant-current power supply 65 is a constant-current power supply without a function of temperature compensation or having a low degree of temperature dependence. The second constant-current power supply 65 draws a second current draw id2, which is a constant current, from the node 70a on the one side of the subtraction-side current amplifier unit 70.

At the node n5 of the second bias power supply unit 60, the second amplified current ia2 is subtracted from the second current draw id2 drawn by the second constant-current power supply 65. As a result, a second total current it2 (it2=id2−ia2) obtained by subtracting the second amplified current ia2 from the second current draw id2 flows at the node 70a on the one side of the subtraction-side current amplifier unit 70; thus, a second voltage, which is necessary to cause the second total current it2 to flow, is generated across the one side of the one side of the subtraction-side current amplifier unit 70.

When the second voltage is generated across the one side of the subtraction-side current amplifier unit 70, the second voltage is also generated across the other side of the subtraction-side current amplifier unit 70, and an amplified current due to the second voltage is outputted from the node 70b on the other side of the subtraction-side current amplifier unit 70. The amplified current outputted by the subtraction-side current amplifier unit 70, which exhibits a negative temperature characteristic, is supplied as the bias current Ib2 to the power amplifier PA2 and as the bias current Ib3 to the power amplifier PA3.

3. Circuit Configuration of Bias Circuit

Next, a circuit configuration that can implement the above-described function of the bias circuit 20 will be described.

Figure 7:
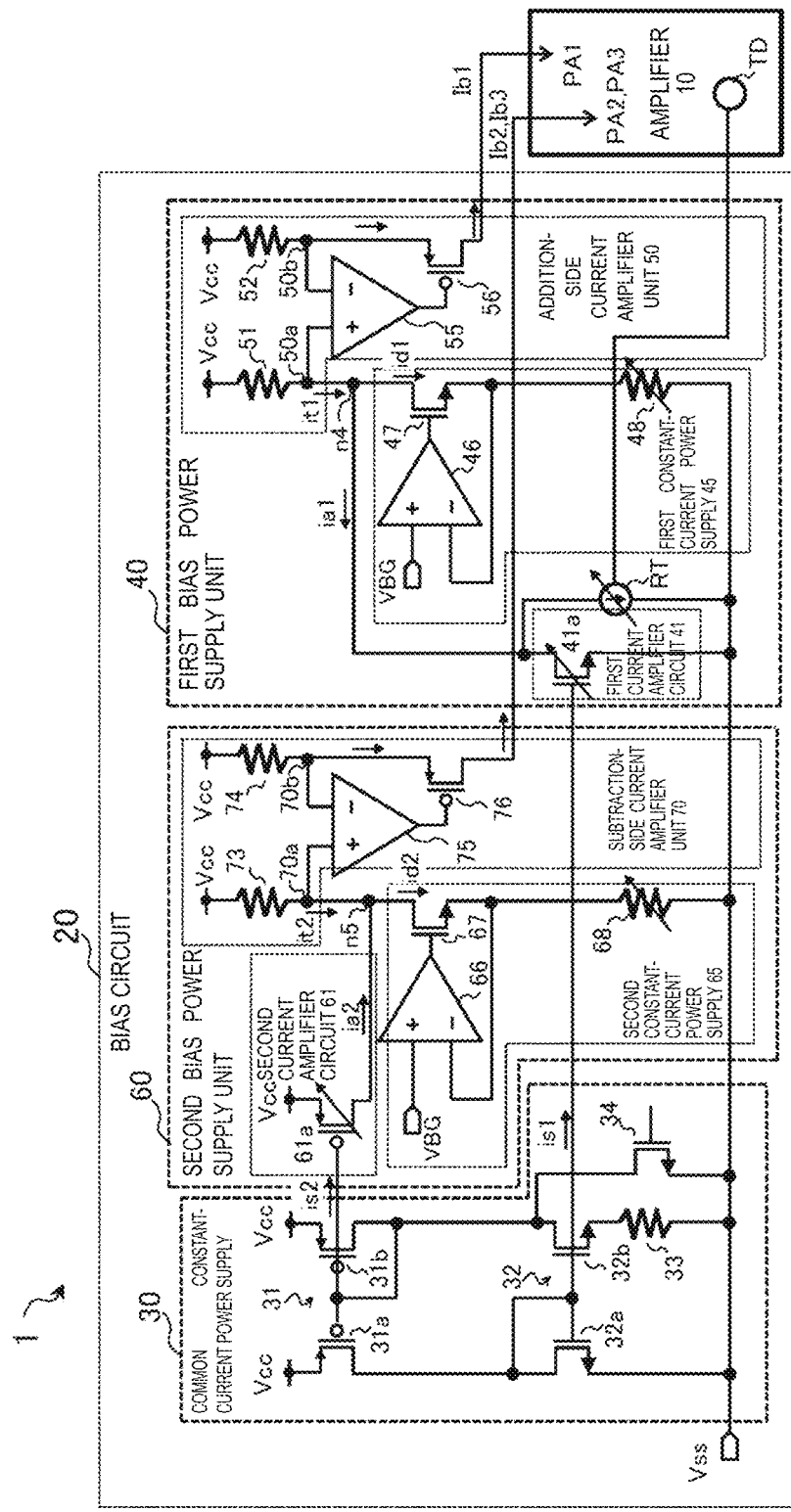
FIG. 7 is a circuit diagram of the bias circuit of the amplifier device according to the embodiment.

FIG. 7 is a circuit diagram of the bias circuit 20 of the amplifier device 1 according to the embodiment.

As described above, the bias circuit 20 includes the first bias power supply unit 40, the second bias power supply unit 60, and the common constant-current power supply 30.

The common constant-current power supply 30 includes a first current mirror circuit 31 coupled to the high-potential power line Vcc, a second current mirror circuit 32 cascade-connected with the first current mirror circuit 31, and a resistance element 33 coupled in series between the second current mirror circuit 32 and a low-potential power line Vss. The first current mirror circuit 31 is constituted by a pair of p-channel metal-oxide-semiconductor (pMOS) field-effect transistor elements (transistors 31a and 31b). The second current mirror circuit 32 is constituted by a pair of n-channel metal-oxide-semiconductor (nMOS) field-effect transistor elements (transistors 32a and 32b). The common constant-current power supply 30 includes the single resistance element 33, which is shared by the first current mirror circuit 31 and the second current mirror circuit 32. The resistance element 33 has a negative temperature characteristic. Thus, the common constant-current power supply 30 outputs currents exhibiting positive temperature characteristics.

An output side of the second current mirror circuit 32 is coupled to the first current amplifier circuit 41. The first supply current is1 is outputted from the output side of the second current mirror circuit 32 to the first current amplifier circuit 41. An output side of the first current mirror circuit 31 is coupled to the second current amplifier circuit 61. The second supply current is2 is outputted from the output side of the first current mirror circuit 31 to the second current amplifier circuit 61.

As described above, the first bias power supply unit 40 is constituted by the first current amplifier circuit 41, the first constant-current power supply 45, and the addition-side current amplifier unit 50.

The first current amplifier circuit 41 includes a current amplifier element 41a that is an nMOS transistor element. The gate of the current amplifier element 41a is coupled to the output side of the second current mirror circuit 32. The source of the current amplifier element 41a is coupled to the low-potential power line Vss. The drain of the current amplifier element 41a is coupled to the node n4. The first current amplifier circuit 41 generates the first amplified current ia1 by amplifying the first supply current is1 outputted by the second current mirror circuit 32.

The first constant-current power supply 45 includes a first operational amplifier 46, a first draw transistor 47, and a first variable resistor 48.

The first draw transistor 47 may be, for example, an nMOS transistor element. A control terminal (gate) of the first draw transistor 47 is coupled to an output side of the first operational amplifier 46. One end (source) of an input-output terminal of the first draw transistor 47 is coupled to the low-potential power line Vss via the first variable resistor 48. The other end (drain) of the input-output terminal of the first draw transistor 47 is coupled to the node n4. The first variable resistor 48 is coupled in series between the one end of the input-output terminal of the first draw transistor 47 and the low-potential power line Vss. One input terminal of the first operational amplifier 46 is coupled to a reference voltage VBG. The other input terminal of the first operational amplifier 46 is coupled to the one end of the input-output terminal of the first draw transistor 47.

In the amplifier device 1, a temperature detection element TD for detecting the temperature of the amplifier 10 is installed in the first IC chip of the amplifier 10. A remote temperature compensator RT coupled to the temperature detection element TD is provided in the first bias power supply unit 40. The remote temperature compensator RT can remotely operate active elements and variable elements in accordance with the temperature detected by the temperature detection element TD.

The addition-side current amplifier unit 50 includes an addition-side operational amplifier 55 serving as a comparator, a first detection resistor 51 and a second detection resistor 52 that are used for comparison, and a bias output transistor 56. The first detection resistor 51 and the second detection resistor 52 used for comparison are different in resistance from each other. The bias output transistor 56 may be, for example, a pMOS transistor element.

The first detection resistor 51 is coupled to a first input terminal of the addition-side operational amplifier 55. The second detection resistor 52 is coupled to a second input terminal of the addition-side operational amplifier 55. The bias output transistor 56 is coupled to an output side of the addition-side operational amplifier 55.

The first detection resistor 51 is coupled in series between the node 50a on the one side of the addition-side current amplifier unit 50 and the high-potential power line Vcc. The first detection resistor 51 is coupled to the node n4 via the node 50a on the one side of the addition-side current amplifier unit 50. The second detection resistor 52 is coupled in series between the node 50b on the other side of the addition-side current amplifier unit 50 and the high-potential power line Vcc. The second detection resistor 52 is coupled to the drain of the bias output transistor 56 via the node 50b on the other side of the addition-side current amplifier unit 50.

The gate of the bias output transistor 56 is coupled to the output side of the addition-side operational amplifier 55. The drain of the bias output transistor 56 is coupled to the second detection resistor 52 via the node 50b on the other side of the addition-side current amplifier unit 50. The source of the bias output transistor 56 is coupled to the power amplifier PA1 of the amplifier 10.

At the node n4 of the first bias power supply unit 40, the first amplified current ia1 is added to the first current draw id1 drawn by the first constant-current power supply 45. As a result, the first total current it1 obtained by adding the first current draw id1 and the first amplified current ia1 flows at the node 50a on the one side of the addition-side current amplifier unit 50; thus, the first voltage, which is necessary to cause the first total current it1 to flow, is generated across the one side of the addition-side current amplifier unit 50.

When the first voltage is generated across the one side of the addition-side current amplifier unit 50, the first voltage is also generated across the other side of the addition-side current amplifier unit 50 by the addition-side operational amplifier 55 and the bias output transistor 56, and an amplified current caused by the first voltage is outputted from the node 50b on the other side of the addition-side current amplifier unit 50. The amplification factor of the amplified current is determined by the resistance of the first detection resistor 51 and the resistance of the second detection resistor 52. For example, the second detection resistor 52 is lower in resistance than the first detection resistor 51. The amplified current outputted by the addition-side current amplifier unit 50, which exhibits a positive temperature characteristic, is supplied as the bias current Ib1 to the power amplifier PA1.

The second bias power supply unit 60 includes the second current amplifier circuit 61, the second constant-current power supply 65, and the subtraction-side current amplifier unit 70.

The second current amplifier circuit 61 includes a current amplifier element 61a formed by a pMOS transistor element. The gate of the current amplifier element 61a is coupled to the output side of the first current mirror circuit 31. The source of the current amplifier element 61a is coupled to the node n5. The drain of the current amplifier element 61a is coupled to the high-potential power line Vcc. The second current amplifier circuit 61 generates the second amplified current ia2 by amplifying the second supply current is2 outputted by the first current mirror circuit 31.

The second constant-current power supply 65 includes a second operational amplifier 66, a second draw transistor 67, and a second variable resistor 68.

The second draw transistor 67 may be, for example, an nMOS transistor element. A control terminal (gate) of the second draw transistor 67 is coupled to an output side of the second operational amplifier 66. One end (source) of an input-output terminal of the second draw transistor 67 is coupled to the low-potential power line Vss via the second variable resistor 68. The other end (drain) of the input-output terminal of the second draw transistor 67 is coupled to the node n5. The second variable resistor 68 is coupled in series between the one end of the input-output terminal of the second draw transistor 67 and the low-potential power line Vss. One input terminal of the second operational amplifier 66 is coupled to the reference voltage VBG. The other input terminal of the second operational amplifier 66 is coupled to the one end of the input-output terminal of the second draw transistor 67.

The subtraction-side current amplifier unit 70 includes a subtraction-side operational amplifier 75 serving as a comparator, a third detection resistor 73 and a fourth detection resistor 74 that are used for comparison, and a bias output transistor 76. The third detection resistor 73 and the fourth detection resistor 74 used for comparison are different in resistance from each other. The bias output transistor 76 may be, for example, a pMOS transistor element.

The third detection resistor 73 is coupled to a first input terminal of the subtraction-side operational amplifier 75. The fourth detection resistor 74 is coupled to a second input terminal of the subtraction-side operational amplifier 75. The bias output transistor 76 is coupled to an output side of the subtraction-side operational amplifier 75.

The third detection resistor 73 is coupled in series between the node 70a on the one side of the subtraction-side current amplifier unit 70 and the high-potential power line Vcc. The third detection resistor 73 is coupled to the node n5 via the node 70a on the one side of the subtraction-side current amplifier unit 70. The fourth detection resistor 74 is coupled in series between the node 70b on the other side of the subtraction-side current amplifier unit 70 and the high-potential power line Vcc. The fourth detection resistor 74 is coupled to the drain of the bias output transistor 76 via the node 70b on the other side of the subtraction-side current amplifier unit 70.

The gate of the bias output transistor 76 is coupled to the output side of the subtraction-side operational amplifier 75. The drain of the bias output transistor 76 is coupled to the fourth detection resistor 74 via the node 70b on the other side of the subtraction-side current amplifier unit 70. The source of the bias output transistor 76 is coupled to the power amplifiers PA2 and PA3 of the amplifier 10 via the bias branch BB.

At the node n5 of the second bias power supply unit 60, the second amplified current ia2 is subtracted from the second current draw id2 drawn by the second constant-current power supply 65. As a result, the second total current it2 obtained by subtracting the second amplified current ia2 from the second current draw id2 flows at the node 70a on the one side of the subtraction-side current amplifier unit 70; thus, the second voltage, which is necessary to cause the second total current it2 to flow, is generated across the one side of the subtraction-side current amplifier unit 70.

When the second voltage is generated across the one side of the subtraction-side current amplifier unit 70, the second voltage is also generated across the other side of the subtraction-side current amplifier unit 70 by the subtraction-side operational amplifier 75 and the bias output transistor 76, and an amplified current caused by the second voltage is outputted from the node 70b on the other side of the subtraction-side current amplifier unit 70. The amplification factor of the amplified current is determined by the resistance of the third detection resistor 73 and the resistance of the fourth detection resistor 74. For example, the fourth detection resistor 74 is lower in resistance than the third detection resistor 73. The amplified current outputted by the subtraction-side current amplifier unit 70, which exhibits a negative temperature characteristic, is supplied as the bias current Ib2 to the power amplifier PA2 and as the bias current Ib3 to the power amplifier PA3.

4. Effects

The amplifier device 1 according to the present embodiment includes the amplifier 10 including the cascade-connected power amplifiers PA1, PA2, and PA3 provided in a plurality of stages and the bias circuit 20 for supplying bias current to the amplifier 10. The bias current Ib1 supplied to the power amplifier PA1 in the first stage of the power amplifiers PA1 to PA3 in the plurality of stages exhibits a positive temperature characteristic. The bias current Ib3 supplied to the power amplifier PA3 in the final stage exhibits a negative temperature characteristic.

As such, the bias current Ib1 supplied to the power amplifier PA1 in the first stage exhibits a positive temperature characteristic, and the bias current Ib3 supplied to the power amplifier PA3 in the final stage exhibits a negative temperature characteristic, and as a result, the EVM of the amplifier 10 can be reduced. With this configuration, the amplifier device 1 can avoid unstable variations in characteristics due to changes in the temperature.

A bias current supplied to a power amplifier in a particular stage of the power amplifiers PA1 to PA3 provided in the plurality of stages may exhibit a temperature characteristic more negative than a temperature characteristic exhibited by a bias current supplied to a power amplifier in a stage before the particular stage of the power amplifiers provided in the plurality of stages.

With this configuration, the amplifier device 1 can avoid unstable variations in characteristics due to changes in the temperature.

The bias circuit 20 includes the first bias power supply unit 40 configured to output the bias current Ib1 supplied to the power amplifier PA1 in the first stage, the second bias power supply unit 60 configured to output the bias current Ib3 supplied to the power amplifier PA3 in the final stage, and the common constant-current power supply 30 configured to supply currents individually to the first bias power supply unit 40 and the second bias power supply unit 60.

Because the common constant-current power supply 30 serving as a common current source supplies currents to the first bias power supply unit 40 and the second bias power supply unit 60, the amplifier device 1 including the bias circuit 20 can be downsized.

The first bias power supply unit 40 may include the first current amplifier circuit 41 configured to generate the first amplified current ia1 by amplifying the first supply current is1 supplied by the common constant-current power supply 30 and also include the first constant-current power supply 45. The second bias power supply unit 60 may include the second current amplifier circuit 61 configured to generate the second amplified current ia2 by amplifying the second supply current is2 supplied by the common constant-current power supply 30 and also include the second constant-current power supply 65. At the first bias power supply unit 40, the first amplified current ia1 may be added to the first current draw id1 drawn by the first constant-current power supply 45. At the second bias power supply unit 60, the second amplified current ia2 may be subtracted from the second current draw id2 drawn by the second constant-current power supply 65.

With this configuration, the addition causes the first bias power supply unit 40 to have a positive temperature characteristic, whereas the subtraction causes the second bias power supply unit 60 to have a negative temperature characteristic. As a result, for example, the first bias power supply unit 40 can supply the bias current Ib1 exhibiting the positive temperature characteristic of the first bias power supply unit 40, and the second bias power supply unit 60 can supply the bias current Ib3 exhibiting the negative temperature characteristic of the second bias power supply unit 60. This can reduce the EVM of the amplifier 10. With this configuration, the amplifier device 1 can avoid unstable variations in characteristics due to changes in the temperature.

The common constant-current power supply 30 may include the first current mirror circuit 31 coupled to the high-potential power line Vcc, the second current mirror circuit 32 cascade-connected with the first current mirror circuit 31, and the resistance element 33 having a positive temperature coefficient and coupled in series between the second current mirror circuit 32 and a low-potential power line Vss.

This can simplify the circuit configuration of the common constant-current power supply 30 and downsize the amplifier device 1 including the common constant-current power supply 30.

The first current amplifier circuit 41 may include an nMOS transistor element. The second current amplifier circuit 61 may include a pMOS transistor element. The first current mirror circuit 31 may include a pMOS transistor element. The second current mirror circuit 32 may include an nMOS transistor element. The output side of the second current mirror circuit 32 may be coupled to the first current amplifier circuit 41. The output side of the first current mirror circuit 31 may be coupled to the second current amplifier circuit 61.

With this configuration, the first current amplifier circuit 41 can generate the first amplified current ia1 by amplifying a current (first supply current is1) outputted by the second current mirror circuit 32, and the second current amplifier circuit 61 can generate the second amplified current ia2 by amplifying a current (second supply current is2) outputted by the first current mirror circuit 31. As a result, a current exhibiting a positive temperature characteristic is generated by adding the first amplified current ia1, and then, the bias current Ib1 can be supplied in accordance with the current exhibiting a positive temperature characteristic. A current exhibiting a negative temperature characteristic is generated by subtracting the second amplified current ia2, and then, the bias current Ib3 can be supplied in accordance with the current exhibiting a negative temperature characteristic. This configuration can reduce the EVM of the amplifier 10, and the amplifier device 1 can avoid unstable variations in characteristics due to changes in the temperature.

The first constant-current power supply 45 may include the first operational amplifier 46, the first draw transistor 47 having a control terminal coupled to the output side of the first operational amplifier 46, and the first variable resistor 48 coupled in series between one end of the input-output terminal of the first draw transistor 47 and the low-potential power line Vss.

With this configuration, for example, the first current draw id1 can be changed by changing the resistance of the first variable resistor 48, and as a result, the positive temperature characteristic of the bias current Ib1 outputted by the first bias power supply unit 40 can be changed. This configuration enables the adjustment for reducing the EVM of the amplifier 10, and the amplifier device 1 can avoid unstable variations in characteristics due to changes in the temperature. Additionally, because the first current draw id1 is generated by using the first operational amplifier 46 and the first draw transistor 47, a constant amount of the first current draw id1 can be outputted in a short period.

The second constant-current power supply 65 may include the second operational amplifier 66, the second draw transistor 67 having a control terminal coupled to the output side of the second operational amplifier 66, and the second variable resistor 68 coupled in series between one end of the input-output terminal of the second draw transistor 67 and the low-potential power line Vss.

With this configuration, for example, the second current draw id2 can be changed by changing the resistance of the second variable resistor 68, and as a result, the negative temperature characteristic of the bias current Ib3 outputted by the second bias power supply unit 60 can be changed. This configuration enables the adjustment for reducing the EVM of the amplifier 10, and the amplifier device 1 can avoid unstable variations in characteristics due to changes in the temperature. Additionally, because the second current draw id2 is generated by using the second operational amplifier 66 and the second draw transistor 67, a constant amount of the second current draw id2 can be outputted in a short period. This can prevent the characteristics of the amplifier device 1 from being unstable.

The first draw transistor 47 and the second draw transistor 67 may be both nMOS transistor elements.

This configuration can output a constant amount of the first current draw id1 and a constant amount of the second current draw id2 in a period shorter than the period of the case of drawing the first current draw id1 and the second current draw id2 with the use of components other than MOS transistors.

The first bias power supply unit 40 may include the addition-side current amplifier unit 50 configured to generate, in accordance with the first total current it1 obtained by adding the first amplified current ia1 to the first current draw id1, the bias current Ib1 to be supplied to the power amplifier PA1 in the first stage. The second bias power supply unit 60 may include the subtraction-side current amplifier unit 70 configured to generate, in accordance with the second total current it2 obtained by subtracting the second amplified current ia2 from the second current draw id2, the bias current Ib3 to be supplied to the power amplifier PA3 in the final stage.

Because the addition-side current amplifier unit 50 and the subtraction-side current amplifier unit 70 are included, the bias current Ib1 supplied to the power amplifier PA1 in the first stage exhibits a positive temperature characteristic and the bias current Ib3 supplied to the power amplifier PA3 in the final stage exhibits a negative temperature characteristic. This configuration can reduce the EVM of the amplifier 10, and the amplifier device 1 can avoid unstable variations in characteristics due to changes in the temperature.

The addition-side current amplifier unit 50 may include the addition-side operational amplifier 55, the first detection resistor 51 coupled in series between the first input terminal of the addition-side operational amplifier 55 and the high-potential power line Vcc, and the second detection resistor 52 coupled in series between the second input terminal of the addition-side operational amplifier 55 and the high-potential power line Vcc. The first detection resistor 51 and the second detection resistor 52 may be different in resistance from each other.

Because the first detection resistor 51 and the second detection resistor 52 are different in resistance from each other, the amplification factor of the current flowing in the addition-side current amplifier unit 50 can be easily changed. With this configuration, the amplifier device 1 can easily avoid unstable variations in characteristics due to changes in the temperature.

The subtraction-side current amplifier unit 70 may include the subtraction-side operational amplifier 75, the third detection resistor 73 coupled in series between the first input terminal of the subtraction-side operational amplifier 75 and the high-potential power line Vcc, and the fourth detection resistor 74 coupled in series between the second input terminal of the subtraction-side operational amplifier 75 and the high-potential power line Vcc. The third detection resistor 73 and the fourth detection resistor 74 may be different in resistance from each other.

Because the third detection resistor 73 and the fourth detection resistor 74 are different in resistance from each other, the amplification factor of the current flowing in the subtraction-side current amplifier unit 70 can be easily changed. With this configuration, the amplifier device 1 can easily avoid unstable variations in characteristics due to changes in the temperature.

OTHER EMBODIMENTS

The amplifier device according to the embodiment of the present disclosure has been described above, but the present disclosure is not limited to the embodiment. For example, the present disclosure can embody the following modifications to the embodiment described above.

For example, although the embodiment indicates the example in which the bias circuit 20 includes two bias power supply units, namely the first bias power supply unit 40 and the second bias power supply unit 60, this should not be construed in a limiting sense. For example, the bias circuit 20 may include a plurality of bias power supply units corresponding to the number of power amplifiers. However, when bias power supply units for supplying bias currents to the power amplifiers PA2 and PA3 are collectively implemented as a single power supply unit as described in the embodiment, circuits such as current and voltage sources can be shared, and as a result, the bias circuit can be downsized.

For example, the amplifier device may be configured to amplify radio-frequency signals of a standard such as the Long Term Evolution (LTE) or wideband code-division multiple access (W-CDMA) standard other than the IEEE 802.11 standard.

The present disclosure can be used as an amplifier device having stable characteristics regardless of changes in the temperature in a wide variety of communication devices. While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An amplifier device comprising:
    an amplifier including cascade-connected power amplifiers in a plurality of stages; and
    a bias circuit configured to supply bias currents to the power amplifiers in the plurality of stages, wherein:
    a first bias current supplied to a power amplifier in a first stage of the power amplifiers in the plurality of stages exhibits a positive temperature characteristic, and
    a second bias current supplied to a power amplifier in a final stage of the power amplifiers in the plurality of stages exhibits a negative temperature characteristic.

2. The amplifier device according to claim 1, wherein a bias current supplied to a power amplifier in one stage of the plurality of stages exhibits a more negative temperature characteristic than a temperature characteristic exhibited by a bias current supplied to a power amplifier in a stage before the one stage of the plurality of stages.

3. The amplifier device according to claim 1, wherein the bias circuit includes:
    a first bias power supply unit configured to output the first bias current,
    a second bias power supply unit configured to output the second bias current, and a common constant-current power supply configured to supply currents individually to the first bias power supply unit and the second bias power supply unit.

4. The amplifier device according to claim 2, wherein the bias circuit includes:
   a first bias power supply unit configured to output the first bias current,
   a second bias power supply unit configured to output the second bias current, and
   a common constant-current power supply configured to supply currents individually to the first bias power supply unit and the second bias power supply unit.

5. The amplifier device according to claim 3, wherein the first bias power supply unit includes:
   a first current amplifier circuit configured to generate a first amplified current by amplifying a first supply current supplied by the common constant-current power supply, and
   a first constant-current power supply,
the second bias power supply unit includes:
   a second current amplifier circuit configured to generate a second amplified current by amplifying a second supply current supplied by the common constant-current power, and
   a second constant-current power supply,
the first bias power supply unit is configured to add the first amplified current to a first current draw drawn by the first constant-current power supply, and
the second bias power supply unit is configured to subtract the second amplified current from a second current draw drawn by the second constant-current power supply.

6. The amplifier device according to claim 5, wherein the common constant-current power supply includes:
   a first current mirror circuit coupled to a high-potential power line,
   a second current mirror circuit cascade-connected to the first current mirror circuit, and
   a resistor having a positive temperature coefficient, the resistor being coupled in series between the second current mirror circuit and a low-potential power line.

7. The amplifier device according to claim 6, wherein the resistor is shared by the first current mirror circuit and the second current mirror circuit.

8. The amplifier device according to claim 6, wherein the resistor has a negative temperature characteristic.

9. The amplifier device according to claim 6, wherein the first current amplifier circuit includes an n-channel metal-oxide-semiconductor (nMOS) transistor,
the second current amplifier circuit includes a p-channel metal-oxide-semiconductor (pMOS) transistor,
the first current mirror circuit includes a pMOS transistor,
the second current mirror circuit includes an nMOS transistor,
an output side of the second current mirror circuit is coupled to the first current amplifier circuit, and
an output side of the first current mirror circuit is coupled to the second current amplifier circuit.

10. The amplifier device according to claim 5, wherein the first constant-current power supply includes:
   a first operational amplifier,
   a first draw transistor having a control terminal coupled to an output side of the first operational amplifier, and
   a first variable resistor coupled in series between one end of an input-output terminal of the first draw transistor and a low-potential power line.

11. The amplifier device according to claim 6, wherein the first constant-current power supply includes:
   a first operational amplifier,
   a first draw transistor having a control terminal coupled to an output side of the first operational amplifier, and
   a first variable resistor coupled in series between one end of an input-output terminal of the first draw transistor and a low-potential power line.

12. The amplifier device according to claim 9, wherein the first constant-current power supply includes:
   a first operational amplifier,
   a first draw transistor having a control terminal coupled to an output side of the first operational amplifier, and
   a first variable resistor coupled in series between one end of an input-output terminal of the first draw transistor and a low-potential power line.

13. The amplifier device according to claim 10, wherein the second constant-current power supply includes:
   a second operational amplifier,
   a second draw transistor having a control terminal coupled to an output side of the second operational amplifier, and
   a second variable resistor coupled in series between one end of an input-output terminal of the second draw transistor and the low-potential power line.

14. The amplifier device according to claim 13, wherein:
the first draw transistor and the second draw transistor are both nMOS transistors.

15. The amplifier device according to claim 5, wherein:
the first bias power supply unit includes an addition-side current amplifier unit configured to generate, in accordance with a first total current obtained by adding the first amplified current to the first current draw, the first bias current, and
the second bias power supply unit includes a subtraction-side current amplifier unit configured to generate, in accordance with a second total current obtained by subtracting the second amplified current from the second current draw, the second bias current.

16. The amplifier device according to claim 6, wherein:
the first bias power supply unit includes an addition-side current amplifier unit configured to generate, in accordance with a first total current obtained by adding the first amplified current to the first current draw, the first bias current, and
the second bias power supply unit includes a subtraction-side current amplifier unit configured to generate, in accordance with a second total current obtained by subtracting the second amplified current from the second current draw, the second bias current.

17. The amplifier device according to claim 9, wherein:
the first bias power supply unit includes an addition-side current amplifier unit configured to generate, in accordance with a first total current obtained by adding the first amplified current to the first current draw, the first bias current, and
the second bias power supply unit includes a subtraction-side current amplifier unit configured to generate, in accordance with a second total current obtained by subtracting the second amplified current from the second current draw, the second bias current.

18. The amplifier device according to claim 15, wherein:
the addition-side current amplifier unit includes:
- an addition-side operational amplifier,
- a first detection resistor coupled in series between a first input terminal of the addition-side operational amplifier and a high-potential power line, and
- a second detection resistor coupled in series between a second input terminal of the addition-side operational amplifier and the high-potential power line, and the first detection resistor and the second detection resistor have different resistance values.

19. The amplifier device according to claim 15, wherein:
the subtraction-side current amplifier unit includes:
- a subtraction-side operational amplifier,
- a third detection resistor coupled in series between a first input terminal of the subtraction-side operational amplifier and the high-potential power line, and
- a fourth detection resistor coupled in series between a second input terminal of the subtraction-side operational amplifier and the high-potential power line, and the third detection resistor and the fourth detection resistor have different resistance values.

20. The amplifier device according to claim 18, wherein:
the subtraction-side current amplifier unit includes:
- a subtraction-side operational amplifier,
- a third detection resistor coupled in series between a first input terminal of the subtraction-side operational amplifier and the high-potential power line, and
- a fourth detection resistor coupled in series between a second input terminal of the subtraction-side operational amplifier and the high-potential power line, and the third detection resistor and the fourth detection resistor have different resistance values.

* * * * *